(12) United States Patent
Hugo et al.

(10) Patent No.: US 10,559,522 B2
(45) Date of Patent: Feb. 11, 2020

(54) INTEGRATED DIE PADDLE STRUCTURES FOR BOTTOM TERMINATED COMPONENTS

(71) Applicant: INTERNATIONAL BUSINESS MACHINES CORPORATION, Armonk, NY (US)

(72) Inventors: Stephen M. Hugo, Stewartville, MN (US); Mark J. Jeanson, Rochester, MN (US); Matthew S. Kelly, Oakville (CA)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/018,098

(22) Filed: Jun. 26, 2018

(65) Prior Publication Data
US 2018/0301399 A1    Oct. 18, 2018

Related U.S. Application Data

(63) Continuation of application No. 14/972,196, filed on Dec. 17, 2015, now Pat. No. 10,083,894.

(51) Int. Cl.
*H05K 1/00* (2006.01)
*H05K 1/02* (2006.01)
(Continued)

(52) U.S. Cl.
CPC .. *H01L 23/49503* (2013.01); *H01L 23/49541* (2013.01); *H05K 1/0206* (2013.01);
(Continued)

(58) Field of Classification Search
CPC .. H05K 1/00; H05K 1/02; H05K 1/03; H05K 3/30; H01L 23/10; H01L 23/12;
(Continued)

(56) References Cited

U.S. PATENT DOCUMENTS 6,117,705 A * 9/2000 Glenn ................ G11C 16/18
257/E23.181
6,750,546 B1    6/2004 Villanueva et al.
(Continued)

FOREIGN PATENT DOCUMENTS

EP    1026927 A2    8/2000

OTHER PUBLICATIONS

IBM "List of IBM Patents or Patent Applications Treated as Related (Appendix P)"; Filed Jun. 26, 2018, 2 pages.
(Continued)

*Primary Examiner* — Xiaoliang Chen
(74) *Attorney, Agent, or Firm* — Cantor Colburn LLP; Tihon Poltavets

(57) ABSTRACT

Bottom terminated components and methods of making bottom terminated components are provided. The bottom terminated component includes a die paddle and at least one die paddle structure configured to prevent wicking into a respective thermal via of a printed circuit board. The at least one die paddle structure includes a base defining an axis, the base having an axial thickness extending from the die paddle, and a contact surface configured to contact the printed circuit board at the thermal via of the printed circuit board to prevent wicking of solder into the respective thermal via.

6 Claims, 10 Drawing Sheets

(51) Int. Cl.
  *H05K 3/30* (2006.01)
  *H01L 23/10* (2006.01)
  *H01L 23/12* (2006.01)
  *H01L 23/34* (2006.01)
  *H01L 23/495* (2006.01)
  *H05K 1/18* (2006.01)

(52) U.S. Cl.
  CPC ............ H05K 1/181 (2013.01); H05K 3/303 (2013.01); *H05K 2203/166* (2013.01); *H05K 2203/167* (2013.01); *Y02P 70/613* (2015.11)

(58) Field of Classification Search
  CPC ..... H01L 23/34; H01L 23/367; H01L 23/498; H01L 23/522
  USPC .... 174/250, 252, 255; 257/88, 99, 252, 678, 257/701, 712, 758; 361/719, 720
  See application file for complete search history.

(56) References Cited

U.S. PATENT DOCUMENTS

| | | | |
|---|---|---|---|
| 7,161,240 B2 * | 1/2007 | Barcley | H01L 23/3677 257/675 |
| 7,322,677 B2 | 1/2008 | Silverbrook et al. | |
| 7,658,463 B2 | 2/2010 | Morgan et al. | |
| 8,067,823 B2 | 11/2011 | Lee | |
| 2002/0101256 A1 | 8/2002 | Brown et al. | |
| 2003/0057534 A1 * | 3/2003 | Ho | H01L 23/3128 257/678 |
| 2005/0242437 A1 | 11/2005 | Moxham et al. | |
| 2006/0243998 A1 * | 11/2006 | Nurminen | H01L 33/642 257/99 |
| 2007/0120250 A1 * | 5/2007 | Fairchild | H01L 23/3677 257/712 |
| 2007/0290322 A1 | 12/2007 | Zhao et al. | |
| 2008/0179618 A1 * | 7/2008 | Cheng | H01L 33/486 257/99 |
| 2009/0101395 A1 * | 4/2009 | Horikiri | H05K 3/341 174/255 |
| 2009/0115050 A1 * | 5/2009 | Kasuya | H01L 23/3677 257/701 |
| 2009/0294780 A1 * | 12/2009 | Chou | H05B 33/12 257/88 |
| 2010/0147928 A1 | 6/2010 | Wettermann et al. | |
| 2010/0176503 A1 | 7/2010 | Lee et al. | |
| 2010/0289145 A1 * | 11/2010 | Chipalkatti | H01L 23/36 257/758 |
| 2010/0301470 A1 * | 12/2010 | Gurrum | H01L 23/3171 257/713 |
| 2012/0061127 A1 * | 3/2012 | Fields | H01L 23/373 174/252 |
| 2014/0126156 A1 * | 5/2014 | Naganuma | H05K 1/0206 361/719 |
| 2016/0240471 A1 * | 8/2016 | Klowak | H01L 23/4824 |
| 2016/0260660 A1 * | 9/2016 | Lin | H01L 23/49838 |
| 2017/0179004 A1 | 6/2017 | Hugo et al. | |
| 2018/0053711 A1 | 2/2018 | Hugo et al. | |

OTHER PUBLICATIONS

Bixenman, M. et al.,"Bottom Termination Component Design Considerations to Improve Cleaning", SMTAI, Sep. 30-Oct. 3, 2014, p. 1-16.

* cited by examiner

INTEGRATED DIE PADDLE STRUCTURES FOR BOTTOM TERMINATED COMPONENTS

DOMESTIC PRIORITY

This application is a continuation of U.S. application Ser. No. 14/972,196, titled "INTEGRATED DIE PADDLE STRUCTURES FOR BOTTOM TERMINATED COMPONENTS" filed Dec. 17, 2015, the entire contents of which are incorporated herein by reference.

BACKGROUND

The present disclosure relates generally to bottom terminated components and, more specifically, to integrated die paddle structures for bottom terminated components.

Bottom terminated components require the use of a die paddle directly soldered to a printed circuit board. Solder intended to connect the bottom terminated component to the printed circuit board thermal pad often wicks or flows down thermal via structures under the component, i.e., thermal vias formed in a printed circuit board thermal pad that are provided for thermal cooling of the bottom terminated component. Such solder may thus flow into places where it is not supposed to be and thus may interfere with thermal cooling, current carrying requirements, rework processes, proper assembly and other aspects of the bottom terminated component.

SUMMARY

Bottom terminated components and methods of making bottom terminated components are provided. The bottom terminated component includes a die paddle and at least one die paddle structure configured to prevent wicking into a respective thermal via of a printed circuit board. The at least one die paddle structure includes a base defining an axis, the base having an axial thickness extending from the die paddle, and a contact surface configured to contact the printed circuit board at the thermal via of the printed circuit board to prevent wicking of solder into the respective thermal via.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments provided herein may include bottom terminated components (BTC) that contain a die paddle that is soldered to a printed circuit board (PCB) thermal pad to form an electronic device. The PCB thermal pad consists of exposed copper necessary to form a resultant solder joint interconnect. Within this PCB thermal pad area are thermal vias. The thermal vias are typically through-hole vias which are configured to help to remove heat from the BTC and distribute a heat flux throughout the PCB acting as a large heat sink and ground pad. Further, the thermal vias may enable current carrying capability, thus helping with overall power dissipation and/or function of the electronic device. Embodiments provided herein include the use of die paddle structures that are configured to match and/or cover corresponding thermal via locations on the PCB. When the BTC is mounted to the PCB, the die paddle structures align with the PCB thermal vias, creating a cap or plug structure. The capping or plugging eliminates the possibility of thermal pad solder from travelling down the thermal vias providing many assembly, rework, and reliability benefits.

Embodiments described herein are directed to bottom terminated components. Particularly, embodiments described herein are directed to die paddle structures or features that are configured to prevent solder from wicking down thermal vias in a PCB thermal pad structure. Solder wicking or flowing down thermal vias can result in a wide variety of quality and/or reliability issues during system operation. Embodiments provided herein eliminate or prevent the possibility of solder wicking down the thermal vias. For example, the addition of die paddle structures to the bottom or contact side of a bottom terminated component act as a thermal via plug (or cap) and stand-off when the component is soldered to a printed circuit board.

Bottom terminated components ("BTC") may be used for various applications. For example, bottom terminated components may be used in enterprise servers, storage class hardware, and other electronic hardware and may provide various functions. For example, bottom terminated components may form a class of electronic component package used for a variety of electrical functions including voltage regulation, clocking, logic control, etc.

Figure 1A:
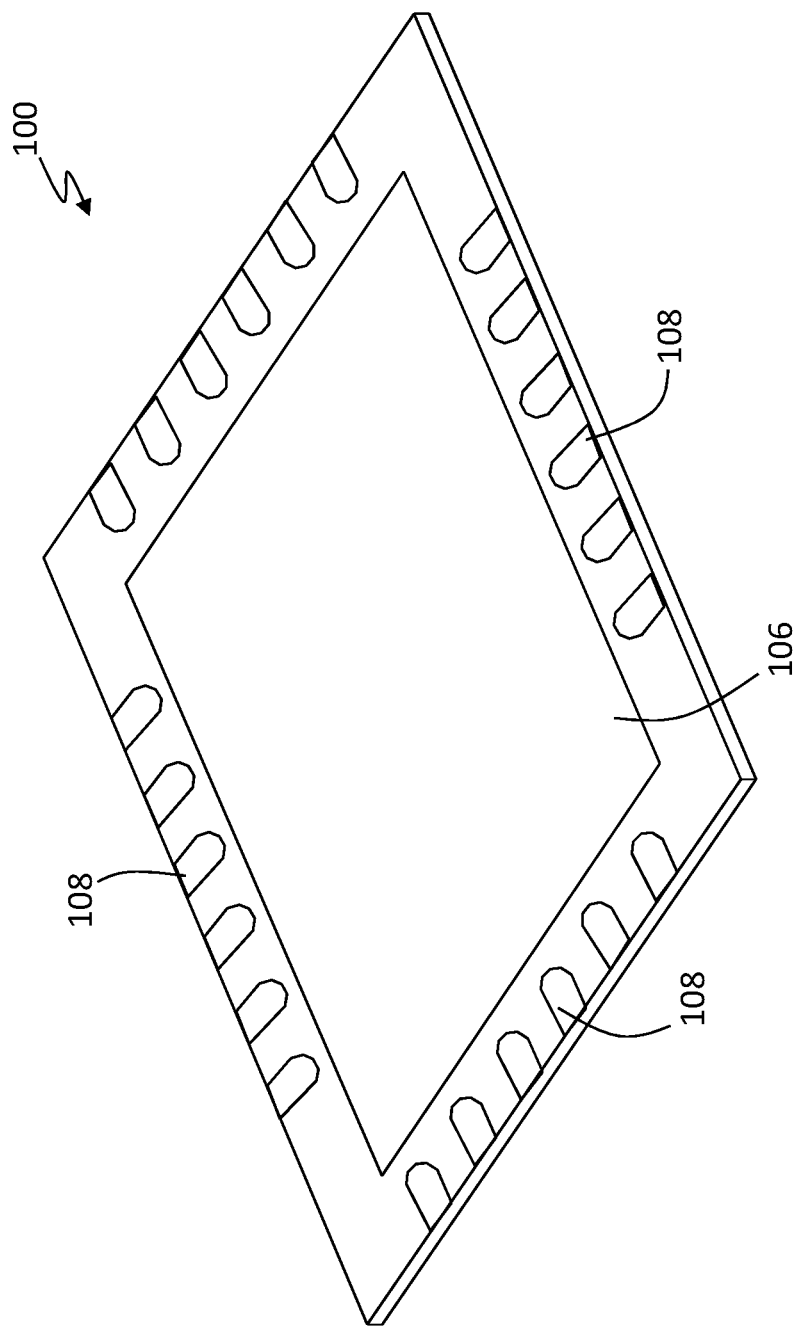
FIG. 1A is a schematic illustration of a bottom terminated component as viewed from the bottom that may incorporate embodiments described herein.
Figure 1B:
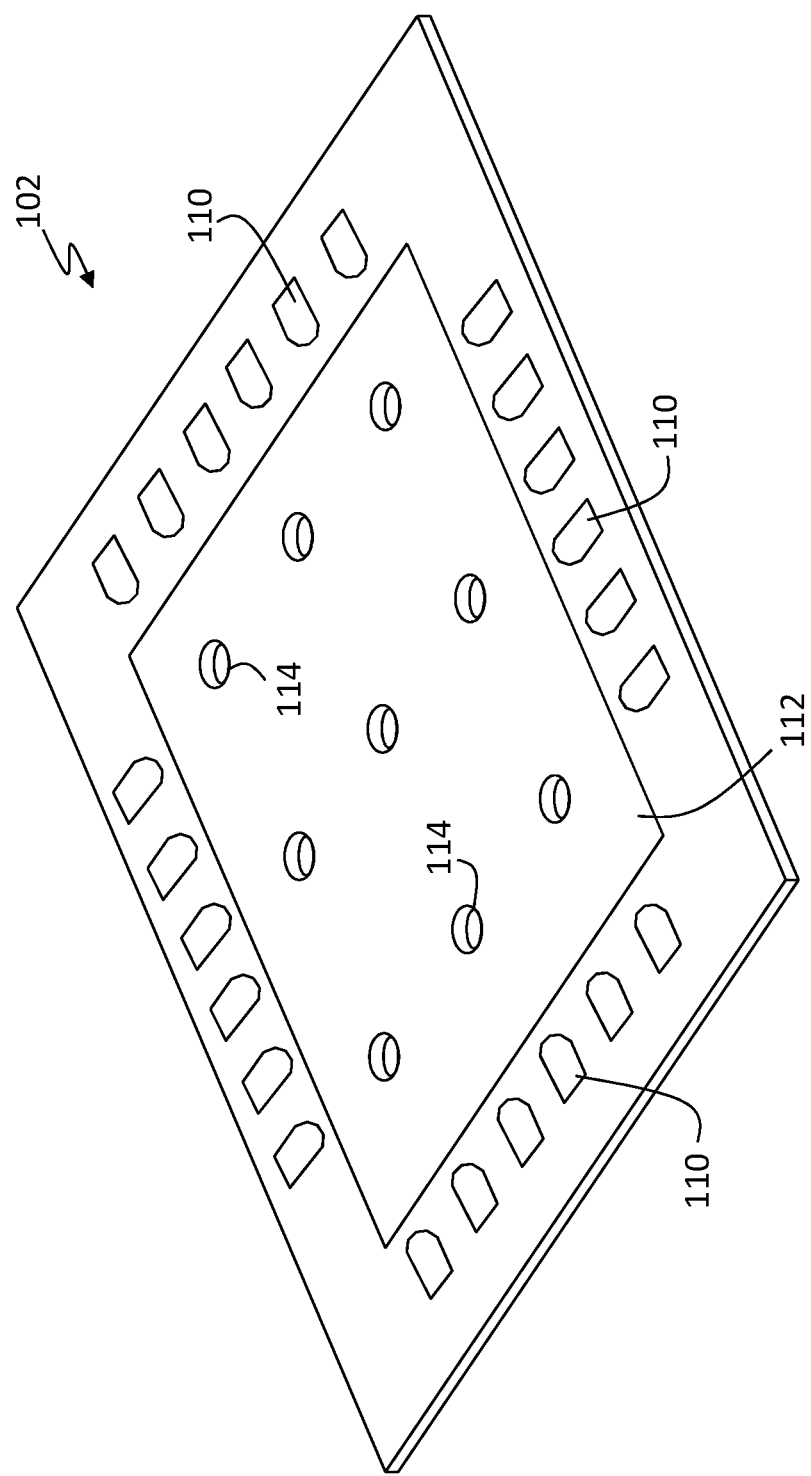
FIG. 1B is a schematic illustration of a printed circuit board that may receive the bottom terminated component of FIG. 1A.
Figure 1C:
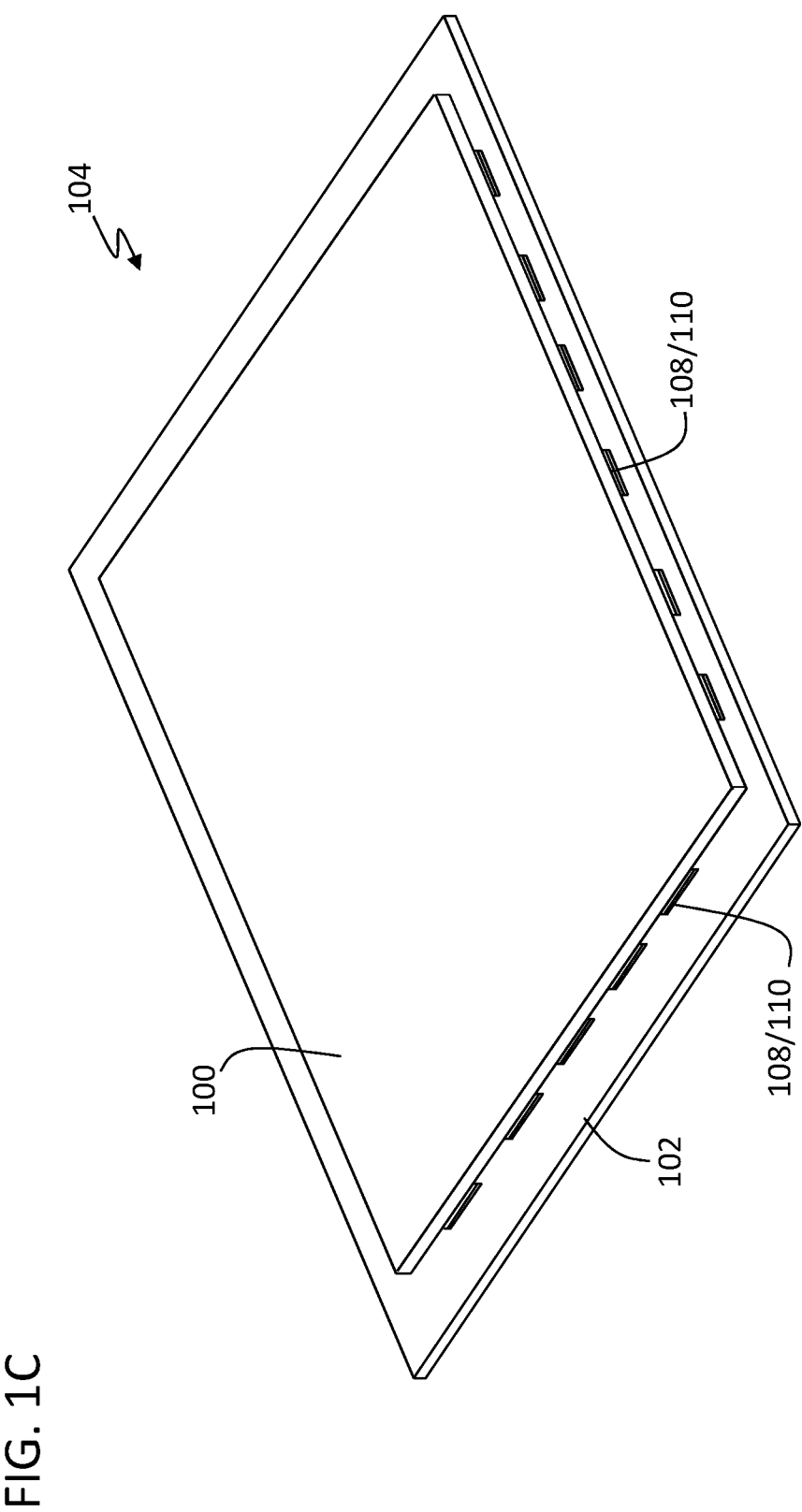
FIG. 1C is a schematic illustration of an electrical device formed by joining the bottom terminated component of FIG. 1A and the printed circuit board of FIG. 1B via solder attachment.

FIGS. 1A-1C show schematic illustrations of the components of a bottom terminated component 100 (FIG. 1A) and a printed circuit board ("PCB") 102 (FIG. 1B) which may be connected to form an electrical device 104 (FIG. 1C). The bottom terminated component 100 may include a BTC die paddle 106 and one or more BTC electrical contacts 108. The BTC electrical contacts may be input and/or output electrical contacts that may be configured to provide signal, power, and/or ground to the bottom terminated component 100.

The printed circuit board 102 may include corresponding PCB electrical contacts 110 that may provide electrical contact to or from the printed circuit board 102 with the bottom terminated component 100. The printed circuit board 102 may also include a PCB thermal pad 112 that may be configured to receive the BTC die paddle 106 and, when in contact with each other, enables thermal and electrical energy transfer between the two parts 100, 102.

The PCB thermal pad 112 may include one or more thermal vias 114. The thermal vias 114 may be holes or other plated apertures that enable and assist the thermal cooling and current carrying capability of the bottom terminated component 100 when the bottom terminated component 100 is mounted to the printed circuit board 102.

As shown in FIG. 1C, the bottom terminated component 100 is mounted to the printed circuit board 102 with the BTC electrical contacts 108 and the PCB electrical contacts 110 in contact with each other. When the bottom terminated component 100 is mounted to the printed circuit board 102, an electrical device 104 is formed.

Figure 2:
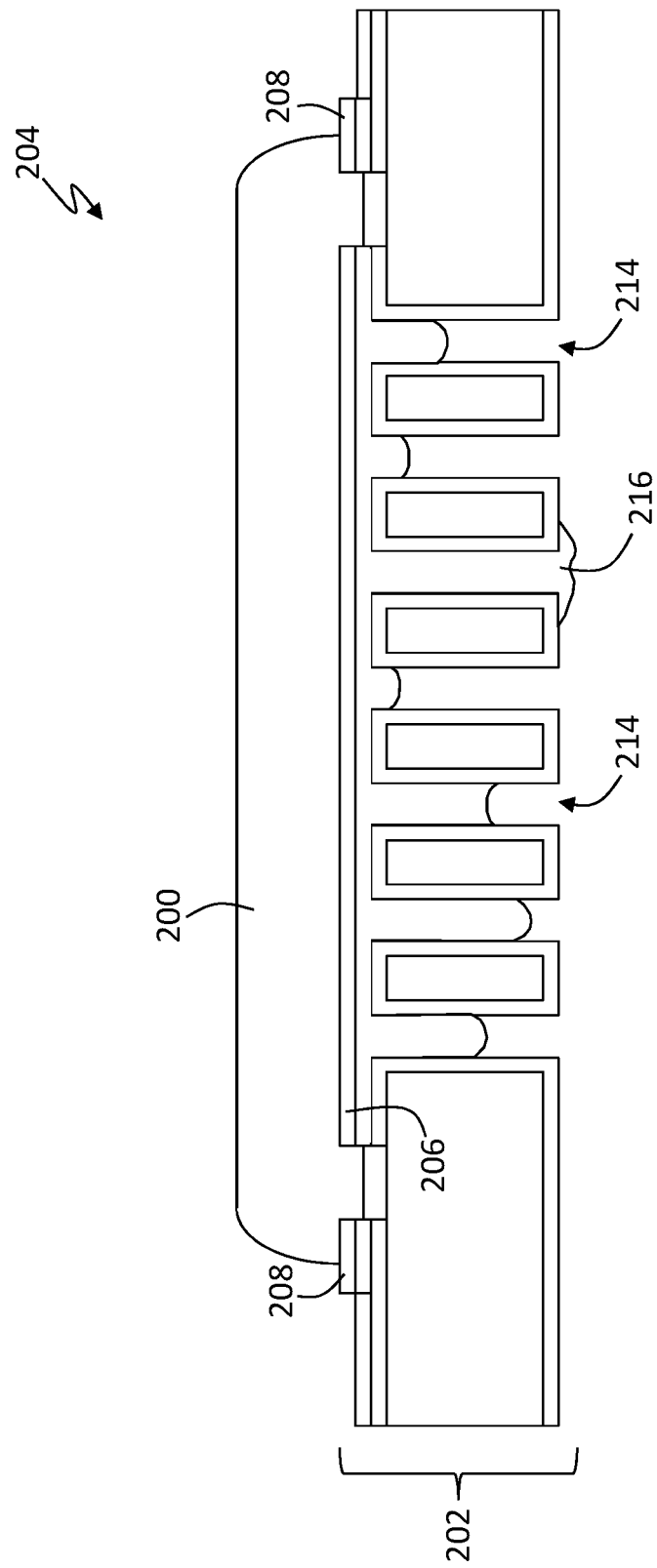
FIG. 2 is a side view schematic illustration of a bottom terminated component mounted on a printed circuit board.

Turning now to FIG. 2, a side, cross-sectional view of a bottom terminated component 200 mounted on a printed circuit board 202 is shown. As shown, the bottom terminated component 200 includes a BTC die paddle 206 and BTC electrical contacts 208. The bottom terminated component 200 is mounted to the printed circuit board 202 to form an electrical device 204. In the cross-sectional view of FIG. 2, the thermal vias 214 of the printed circuit board 202 are shown. During the assembly process to form the electrical device 204, the bottom terminated component 200 may be soldered to the printed circuit board 202.

The bottom terminated component 200 relies, in part, on the BTC die paddle 206 located on the underside of the bottom terminated component 200 (e.g., a planar surface die paddle) to be soldered to the printed circuit board 202 to conduct heat and current away from the bottom terminated component 200 through to the printed circuit board 202. Soldering the BTC die paddle 206 to a thermal pad of the printed circuit board 202 allows the bottom terminated component 200 to be connected to an array of thermal vias 214. The thermal vias 214 act as a heat sink and allow for efficient cooling of the bottom terminated component 200 during operation.

To ensure proper efficiency of the electrical device 204 solder should remain between the thermal pad of the printed circuit board 202 and the BTC die paddle and not travel down the thermal vias 214 of the printed circuit board 202. However, because solder is in liquid form when mounting the bottom terminated component 200 to the printed circuit board 202, the solder may wick into the thermal vias 214. For example, as shown in FIG. 2, solder 216 is shown between the bottom terminated component 200 and the printed circuit board 202, and also flowing into or wicking into the thermal vias 214. Solder wicking down the thermal vias 214 can lead to a variety of quality and reliability performance issues including, but not limited to, part-to-part variation in functional performance, lower component stand-off (leading to lower reliability), increased voiding, lower percentage of thermal pad coverage, difficulty with double-sided assembly, and device overheating.

As provided herein, bottom terminated components are provided with one or more die paddle structures on the BTC die paddle. The die paddle structures are configured to eliminate the possibility of solder being able to travel down thermal vias within the printed circuit board in which the bottom terminated component is mounted. The die paddle structures are added to the bottom terminated component die paddle. As the bottom terminated component is placed onto and mounted to the printed circuit board, the die paddle structures align with and/or plug the printed circuit board thermal vias. As such, liquid solder is not able to wick down the thermal vias and remains where is was originally printed/reflowed, depending on the mounting process used.

Figure 3:
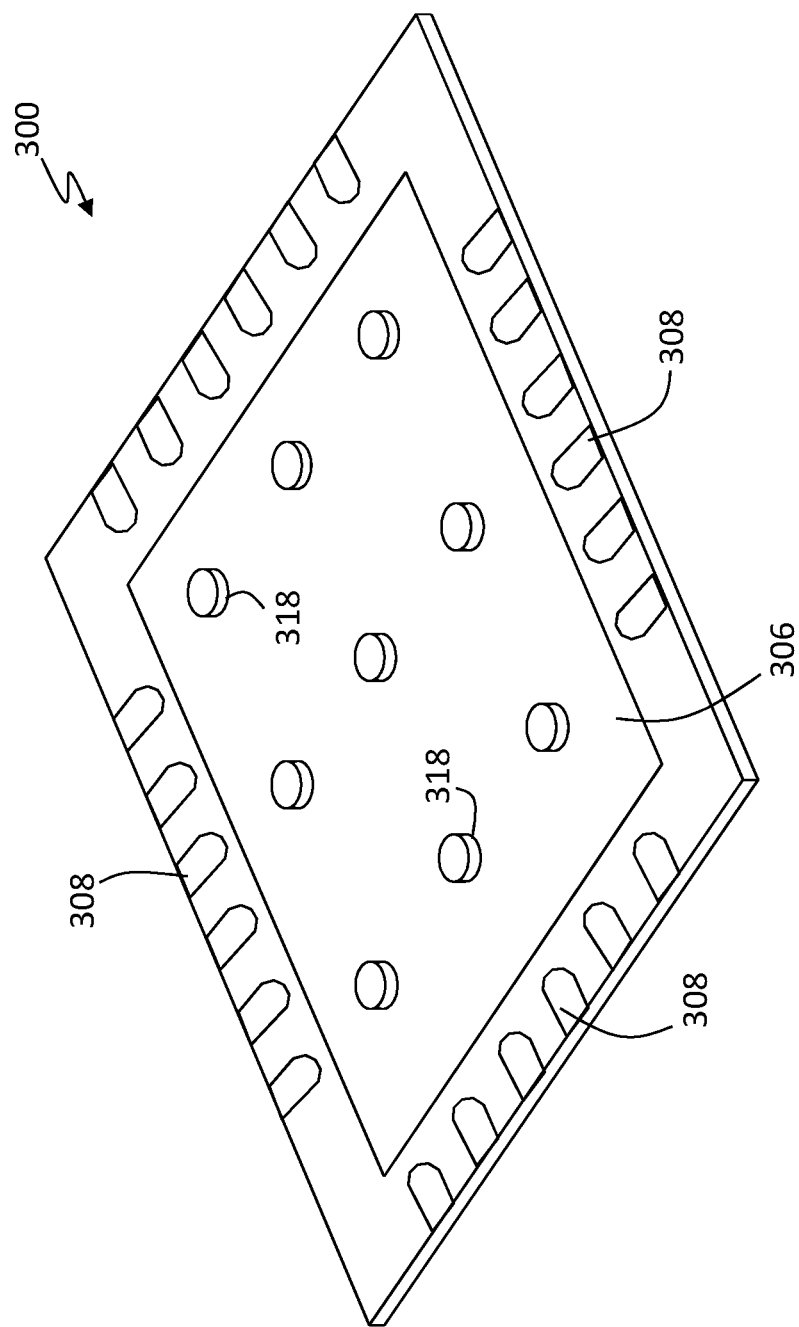
FIG. 3 is a schematic illustration of a bottom terminated component as viewed from the bottom in accordance with an embodiment of the present disclosure.

For example, turning now to FIG. 3, a schematic illustration of a bottom terminated component 300 in accordance with an embodiment of the present disclosure is shown. Bottom terminated component 300 may be substantially similar to bottom terminated component 100 of FIGS. 1A and 1C. Bottom terminated component 300 and may be configured to be mounted to a printed circuit board. As such, the bottom terminated component 300 includes one or more electrical contacts 308 and a die paddle 306.

However, as shown, bottom terminated component 300 also includes one or more die paddle structures 318. The die paddle structures 318 may be bumps or other structures that are configured to align with, cover, and/or plug corresponding thermal vias of a printed circuit board to which the bottom terminated component 300 is to be mounted. The die paddle structures 318 are configured to seal or cap the thermal vias of the printed circuit board, and thus cap and prevent solder from wicking into the respective thermal vias.

In some embodiments the die paddle structures 318 on the bottom terminated component 300 are formed of a thermally and/or electrically conductive material. In some embodiments, the die paddle structures 318 may be formed of or from conductive epoxy materials, although other materials may be used without departing from the scope of the present disclosure. In some embodiments, the die paddle structures 318 may be formed from the same material as the die paddle 306, although this is not required. As such, the die paddle 306 may be in thermal and/or electrical contact with the thermal vias of a printed circuit board to which the bottom terminated component 300 is mounted. As noted above, the thermal vias in the printed circuit boards are plated holes or apertures in the printed circuit board. The die paddle structures 318 are configured such that a portion of the die paddle structure 318 contacts and/or covers a rim or edge of the thermal via aperture, thus preventing solder from wicking into the thermal via.

Further, as shown, the die paddle structures 318 may have a height or length with respect to the surface of the die paddle 306. Accordingly, the die paddle structures 318 may provide a stand-off or clearance and/or positioning of the bottom terminated component 300 with respect to a printed circuit board.

Figure 4:
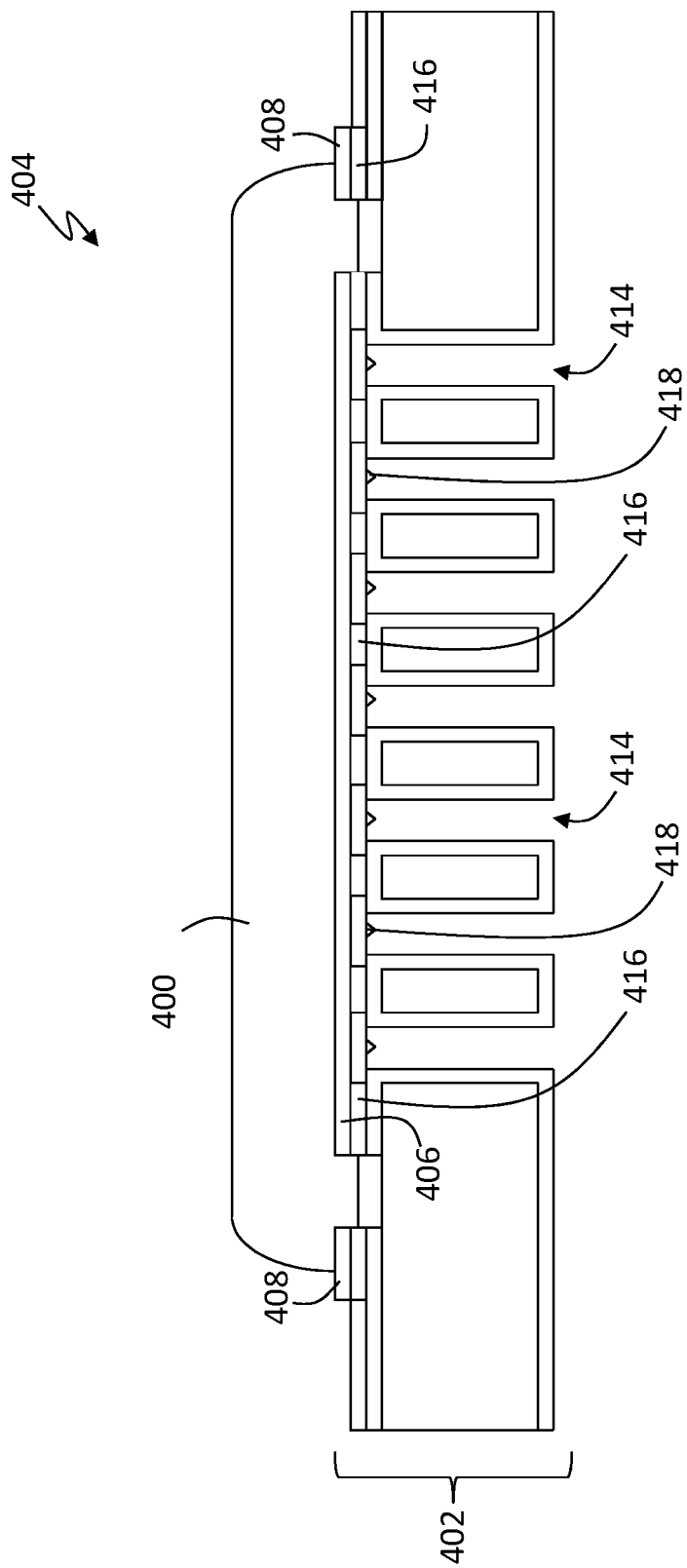
FIG. 4 is a side view schematic illustration of a bottom terminated component in accordance with an embodiment of the present disclosure mounted to a printed circuit board.

Turning now to FIG. 4, a side, cross-sectional view of a bottom terminated component 400 in accordance with an embodiment of the present disclosure is shown. The bottom terminated component 400 is shown mounted to a printed circuit board 402 having a plurality of thermal vias 414 passing there through, with the components forming an electrical device 404. As shown, the bottom terminated component 400 includes a BTC die paddle 406 and BTC electrical contacts 408. The bottom terminated component 400 is mounted to the printed circuit board 402 to form the electrical device 404. In the cross-sectional view of FIG. 4, the thermal vias 414 of the printed circuit board 402 are shown. During the assembly process to form the electrical device 404, the bottom terminated component 400 may be soldered to the printed circuit board 402.

In contrast to that shown in FIG. 2, the bottom terminated component 400 includes a plurality of die paddle structures 418 on the BTC die paddle 406. As shown, the die paddle structures 418 align with and cover the thermal vias 414 of the printed circuit board 402. As such, the solder 416 is prevented from wicking into the thermal vias 414. As shown, the die paddle structures 418 contact a portion of the printed circuit board 402 around the thermal vias 414 such that no solder may enter the thermal vias 414. Further, as shown, the number of die paddle structures 418 is the same as the number of thermal vias 414. Advantageously, solder 416 is prevented from wicking into the thermal vias 414 and efficiency of the electrical device 404 may be improved as compared to electrical devices that do not include die paddle structures 418.

The die paddle structures as disclosed herein can be of various shapes to help with alignment of the bottom terminated component to the printed circuit board while also plugging the thermal via locations.

Figure 5:
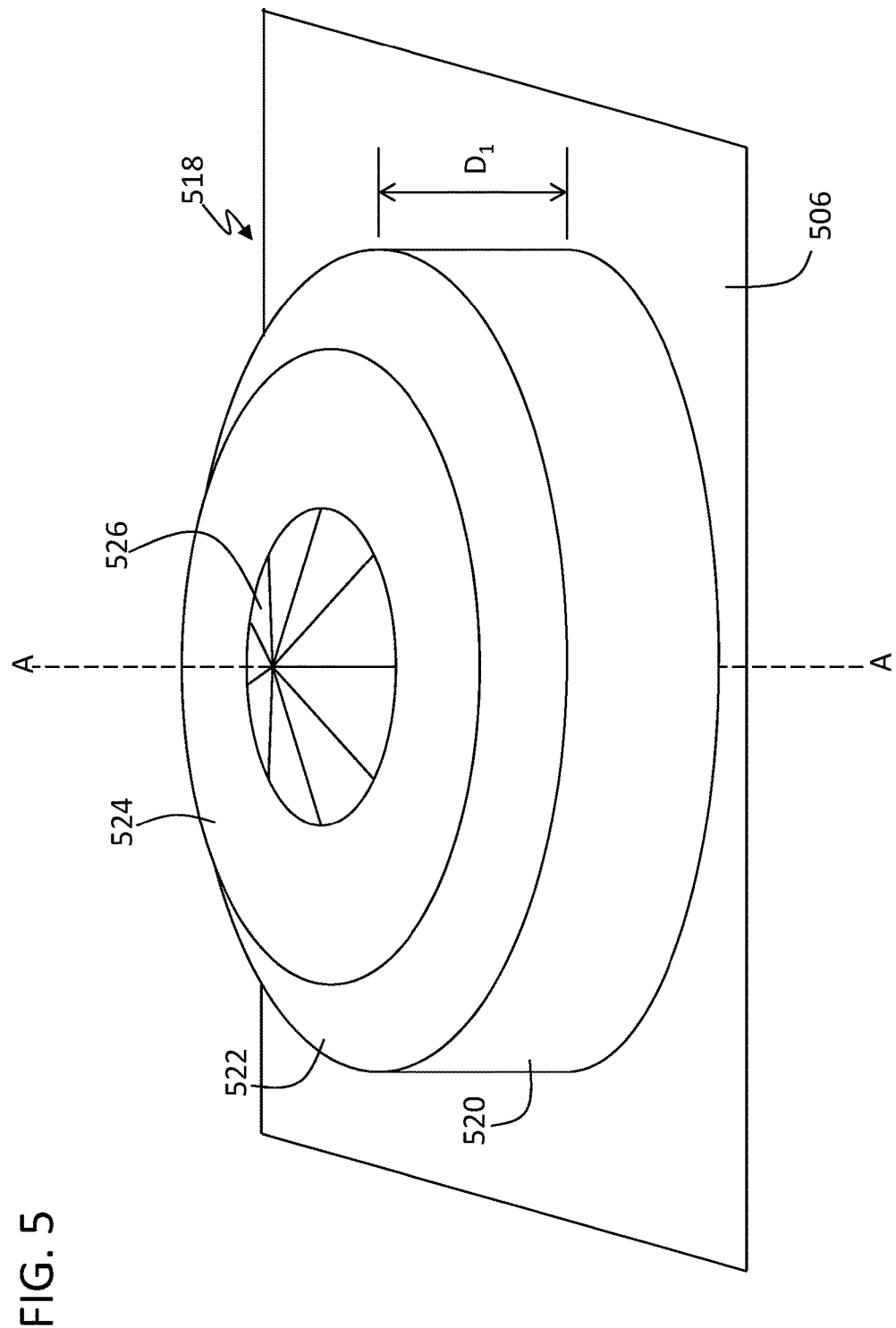
FIG. 5 is a perspective schematic illustration of a die paddle structure in accordance with an embodiment of the present disclosure.

Turning to FIG. 5, a perspective schematic illustration of a die paddle structure 518 is shown. The die paddle structure 518 may be similar to the die paddle structures 418 shown in FIG. 4. As shown, the die paddle structure 518 includes a base 520 having a thickness or depth $D_1$ along axis A-A of the die paddle structure 518. The base 520 may be mounted to, attached to, or part of a BTC die paddle 506 of a bottom terminated component (e.g., as shown in FIG. 4). The depth $D_1$ of the die paddle structure 518 may be configured to provide a setback or stand-off of the die paddle of the bottom terminated component from a PCB thermal pad (e.g., as shown in FIG. 4). The stand-off distance $D_1$ may be configured or set to allow for compensation of solder thicknesses derived from the remaining area of the die paddle 506 (i.e., the surface area of the die paddle 506 not including the die paddle structures 518).

Extending from the base 520 may be an optional tapered portion 522. The tapered portion 522 may be a surface of the die paddle structure 518 that extends radially from an outer edge of the base 520 toward a center of the base 520, and may extend along axis A-A axially away from the base 520, i.e., outward from the BTC die paddle 506.

The die paddle structure 518 further includes a contact surface 524. The contact surface 524 may be configured to be in physical contact with a PCB thermal pad when a bottom terminated component is mounted to and/or in contact with a printed circuit board. The contact surface 524 may define a surface area that is greater than a thermal via that the die paddle structure 518 is configured to cover to prevent solder wicking into the thermal via.

The die paddle structure 518 may also include an optional positioning member 526. The positioning member 526 may be configured to enable positioning of the die paddle structure 518 over and/or in a thermal via of a printed circuit board. As shown, the positioning member 526 may be conical and/or tapered. However, those of skill in the art will appreciate that the positioning member may take any geometry, size, or shape.

Figure 6:
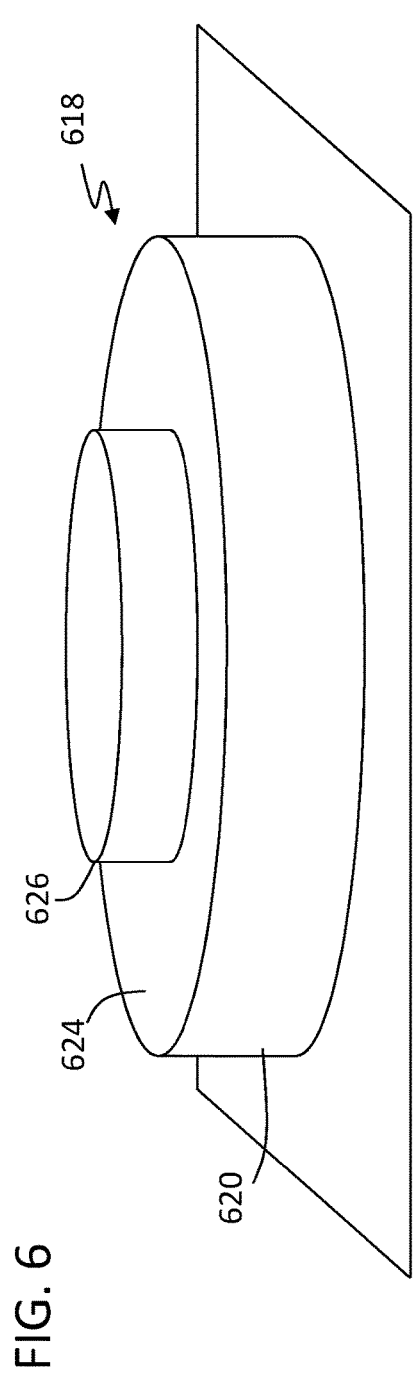
FIG. 6 is an illustration of an alternative configuration of a die paddle structure in accordance with an embodiment of the present disclosure.

Turning now to FIG. 6, an alternative non-limiting embodiment of a die paddle structure 618 in accordance with the present disclosure is shown. As shown in FIG. 6, the die paddle structure 618 includes a base 620, a contact surface 624, and a positioning member 626. In some embodiments configured similar to that shown in FIG. 6, the positioning member 626 may have a diameter that is configured to form an interference fit or otherwise form a fit and/or seal with a thermal via on a printed circuit board. Thus, in some embodiments, a seal may be provided by both the contact surface 624 and the positioning member 626. In other embodiments, the positioning member 626 may have a diameter sufficiently smaller than a respective thermal via such that the positioning member 626 does not provide a seal, but rather only provides positioning of the die paddle structure 618 with respect to a thermal via of a printed circuit board.

Figure 7:
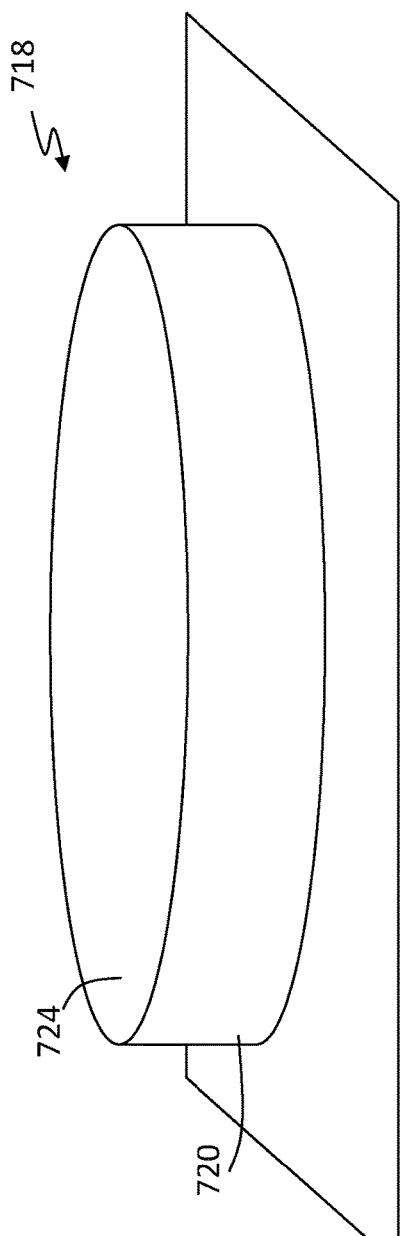
FIG. 7 is an illustration of an alternative configuration of a die paddle structure in accordance with an embodiment of the present disclosure.

Turning now to FIG. 7, another alternative configuration of a die paddle structure in accordance with the present disclosure is shown. In FIG. 7, the die paddle structure 718 includes a base 720 and a contact surface 724. In some embodiments, the contact surface may be configured to rest on and contact a printed circuit board PCB thermal pad and cover thermal vias formed in the PCB thermal pad. In other embodiments having the configuration and/or geometry shown in FIG. 7, the diameter of the base 720 may be of a size to form a seal or fit within a thermal via of a printed circuit board. Thus, in such embodiments, the entire die paddle structure 718 may be configured as a plug used to both provide sealing and positioning during installation of a bottom terminated component to a printed circuit board.

Figure 8:
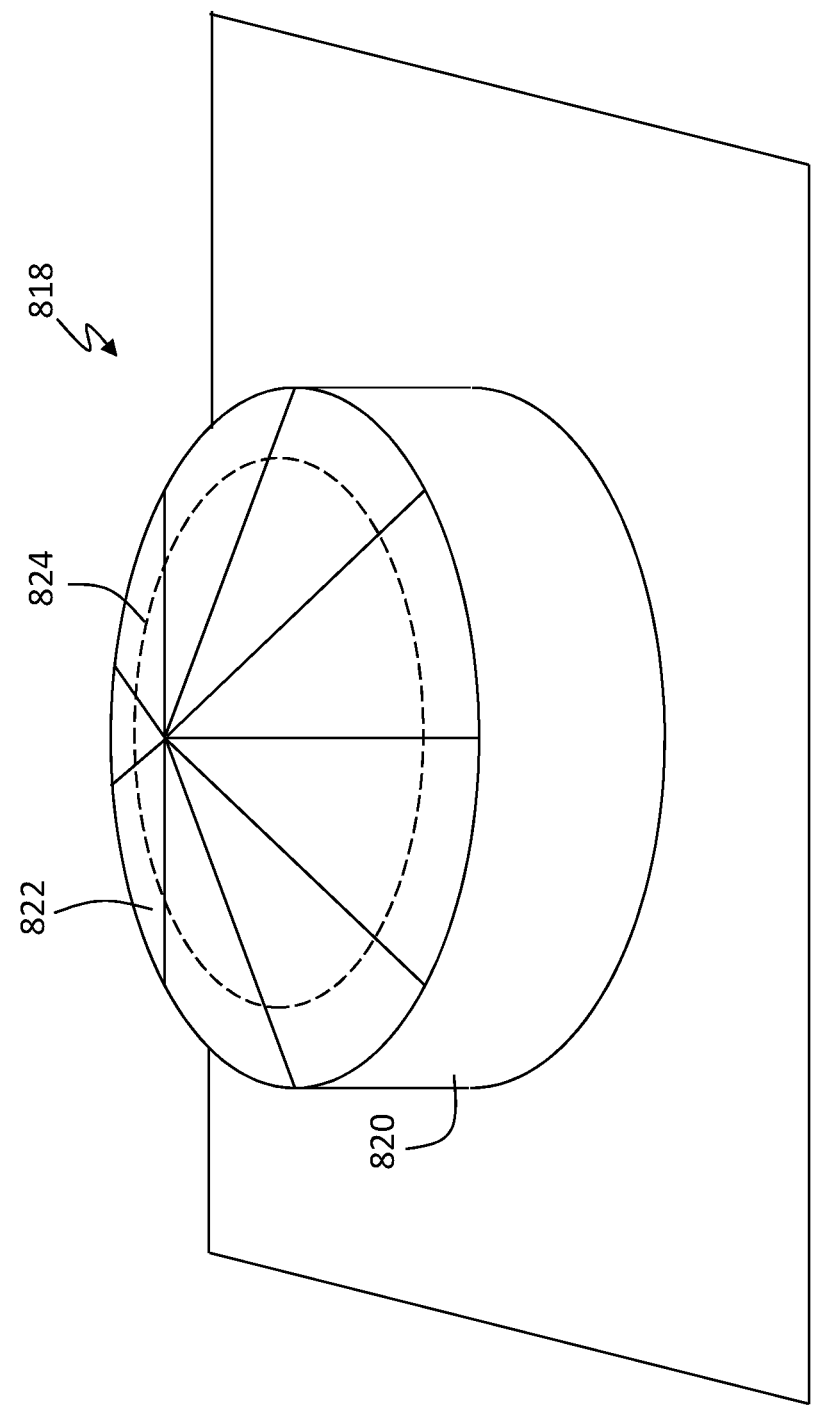
FIG. 8 is an illustration of an alternative configuration of a die paddle structure in accordance with an embodiment of the present disclosure.

Turning now to FIG. 8, another alternative configuration of a die paddle structure in accordance with the present disclosure is shown. In FIG. 8, the die paddle structure 818 includes a base 820 and a tapered portion 822 extending from the base 820. As shown, the tapered portion 822 may extend axially away from the base 820 and taper inward toward a center of the base 820. In this embodiment, the tapered portion 822 extends and forms a point or tip. The point or tip of the tapered portion 822 may act or serve as a positioning feature or element. Because of the tapered nature of the tapered portion 822, a contact surface 824 may be formed as a line contact or ring, as shown in a dashed line. That is, when the die paddle structure 818 is positioned on a printed circuit board, the tapered portion 822 may enable positioning of a bottom terminated component such that the die paddle structures 818 may be positioned in and over respective thermal vias of the printed circuit board. Further, once position, the contact surface 824 may be formed between the tapered portion 822 of the die paddle structure 818 and an edge of the respective thermal vias in the printed circuit board.

Figure 9:
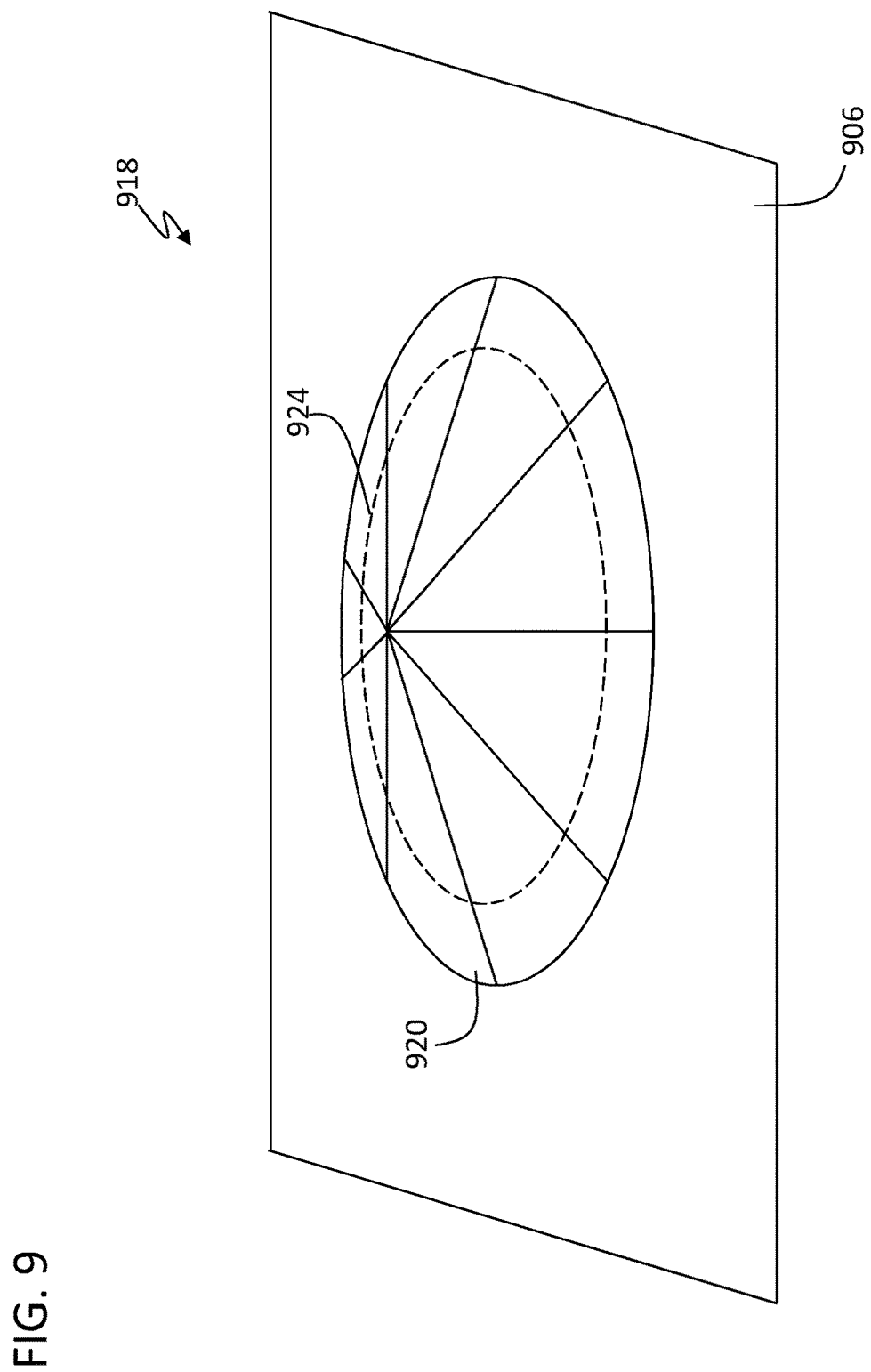
FIG. 9 is an illustration of an alternative configuration of a die paddle structure in accordance with an embodiment of the present disclosure.

Turning now to FIG. 9, another alternative configuration of a die paddle structure in accordance with the present disclosure is shown. In FIG. 9, the die paddle structure 918 includes a base 920 that is tapered extending from a BTC die paddle 906. In such an embodiment, a contact surface 924 may be formed as a line contact or ring at a position along the axial thickness of the base 920. The thickness of the base 920 between the contact surface 924 and the BTC die paddle 906 may be an offset or stand-off of the bottom terminated component from a printed circuit board.

The base may be circular (as shown), or may take any other geometry, such as square, rectangular, etc. Further, the other features/structures of the die paddle structure may have various geometries, shapes, sizes, etc. Thus, the embodiments shown and described above are merely provided as examples of embodiments of the present disclosure, and the shown embodiments are limiting.

The die paddle structures provided herein may be mounted and/or attached to a BTC die paddle of a bottom terminated component or may be integrally formed with the die paddle or other part of a bottom terminated component. Thus, in some embodiments, the die paddle structures may be formed by mold or other process during the formation of the die paddle of the bottom terminated component.

Technical effects and benefits include a bottom terminated component that is configured to prevent wicking of solder into thermal vias of a printed circuit board to which the bottom terminated component may be mounted. Further technical effects and benefits include a means for accurately positioning a bottom terminated component on a printed circuit board. Further technical effects and benefits include die paddle structures that are integrally formed with a die paddle of a bottom terminated component. Further technical effects and benefits may include that a bottom terminated component supplier may determine a proper number and location of thermal vias and a printed circuit board may be configured to match the location and number of die paddle structures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A bottom terminated component comprising:
a die paddle; and
at least one die paddle structure configured to prevent wicking into a respective thermal via of a printed circuit board, the at least one die paddle structure comprising:
a base defining an axis, the base having an axial thickness extending from the die paddle;
a contact surface configured to contact the printed circuit board at the thermal via of the printed circuit board to prevent wicking of solder into the respective thermal via; and
a positioning member tapered in an axial direction, the positioning member configured to enable positioning the bottom terminated component on a printed circuit the positioning member is, wherein the positioning member extends from the contact surface in an axial direction away from the base.

2. The bottom terminated component of claim 1, wherein the contact surface is a line contact on the positioning member.

3. The bottom terminated component of claim 1, wherein the axial thickness of the base defines a stand-off of the die paddle from the printed circuit board, when the bottom terminated component is mounted to the printed circuit board.

4. The bottom terminated component of claim 1, wherein the base is tapered and the contact surface is a line contact on the tapered base.

5. The bottom terminated component of claim 1, wherein contact surface is a flat surface that is parallel with the die paddle.

6. The bottom terminated component of claim 1, wherein the at least one die paddle structure is integrally formed with the die paddle.

* * * * *